United States Patent [19]
Hoyle, Jr. et al.

[11] Patent Number: 6,115,258
[45] Date of Patent: Sep. 5, 2000

[54] CIRCUIT BOARD CHASSIS

[75] Inventors: Willard O. Hoyle, Jr., Sterling; Robert Craig Abraham, Ashland; Keith A. St. Pierre, Stow; Vincent T. Curran, Walpole, all of Mass.

[73] Assignee: Lucent Technologies, Inc., Holmdel, N.J.

[21] Appl. No.: 09/069,026

[22] Filed: Apr. 27, 1998

[51] Int. Cl.[7] .................................................... H01R 4/58
[52] U.S. Cl. ........................ 361/752; 361/756; 361/759; 361/798; 361/796; 439/297; 211/41.17
[58] Field of Search .................................... 361/752, 756, 361/759, 798, 801, 802, 796, 761, 803, 724, 727, 753, 797; 439/297, 377, 630; 206/706; 211/41.17

[56] References Cited

U.S. PATENT DOCUMENTS

| | | | |
|---|---|---|---|
| 4,742,429 | 5/1988 | Arrendiell et al. | 361/391 |
| 5,680,294 | 10/1997 | Stora et al. | 361/695 |
| 5,791,917 | 8/1998 | Eberhardt et al. | 439/79 |
| 5,868,585 | 2/1999 | Barthel et al. | 439/377 |

*Primary Examiner*—Gerald Tolin
*Assistant Examiner*—Hung Van Duong
*Attorney, Agent, or Firm*—Cesari and McKenna, LLP

[57] ABSTRACT

A chassis system for housing a plurality of circuit boards, such as PCI standard bus boards, provides a rack-mountable chassis having an open front side and a motherboard with a plurality of board connectors arranged side-by-side with respect to the front end. The boards are mounted in individual frameworks that facilitate ready installation and removal from the chassis. In particular, the chassis includes a plurality of tracks on its top, aligned with each of the motherboard connectors. The tracks receive a track-engaging portion of each framework. A board-carrying portion of the framework is connected to the track-engaging portion by a lifter mechanism, such as a set of sloped slots and interengaging rollers. The framework can be inserted and removed from the chassis with the board connector raised above the motherboard connector. When the board connector is fully aligned with the motherboard connector in the chassis, the lifter mechanism can be operated to lower the board and its board connector into engagement with the motherboard connector.

20 Claims, 6 Drawing Sheets

Fig. 8

CIRCUIT BOARD CHASSIS

FIELD OF INVENTION

This invention relates to a circuit board chassis, and more particularly to housings for storing multiple circuit boards stacked together in a vertical rack.

BACKGROUND OF INVENTION

Housings or chassis having removable covers are commonly used for storing eight or more printed circuit boards in a parallel, front-to-back arrangement. Computer systems and network servers often require substantial numbers of individual circuit boards. Each of the boards in a particular housing is typically tied to a housing mother board using appropriate strip connectors each having a plurality of contact pads. The mother board of each housing is tied to the system or network using serial or parallel communication lines. The circuit boards can also include various input/output (I/O) connectors along the rear edge. When the boards are mounted in respective strip connectors on the mother board, the I/O edge connectors are accessible through ports in the rear housing side wall.

When the number of circuit boards required exceeds the volume of a standard housing, additional chassis or housings must be employed. Multiple chassis are typically arranged in a vertical stack in a rack. The rack and each chassis include prealigned mounting holes that enable each chassis to be bolted to the rack at an appropriate elevation. To save space, each chassis is usually mounted as close to the others as possible.

Figure 1:
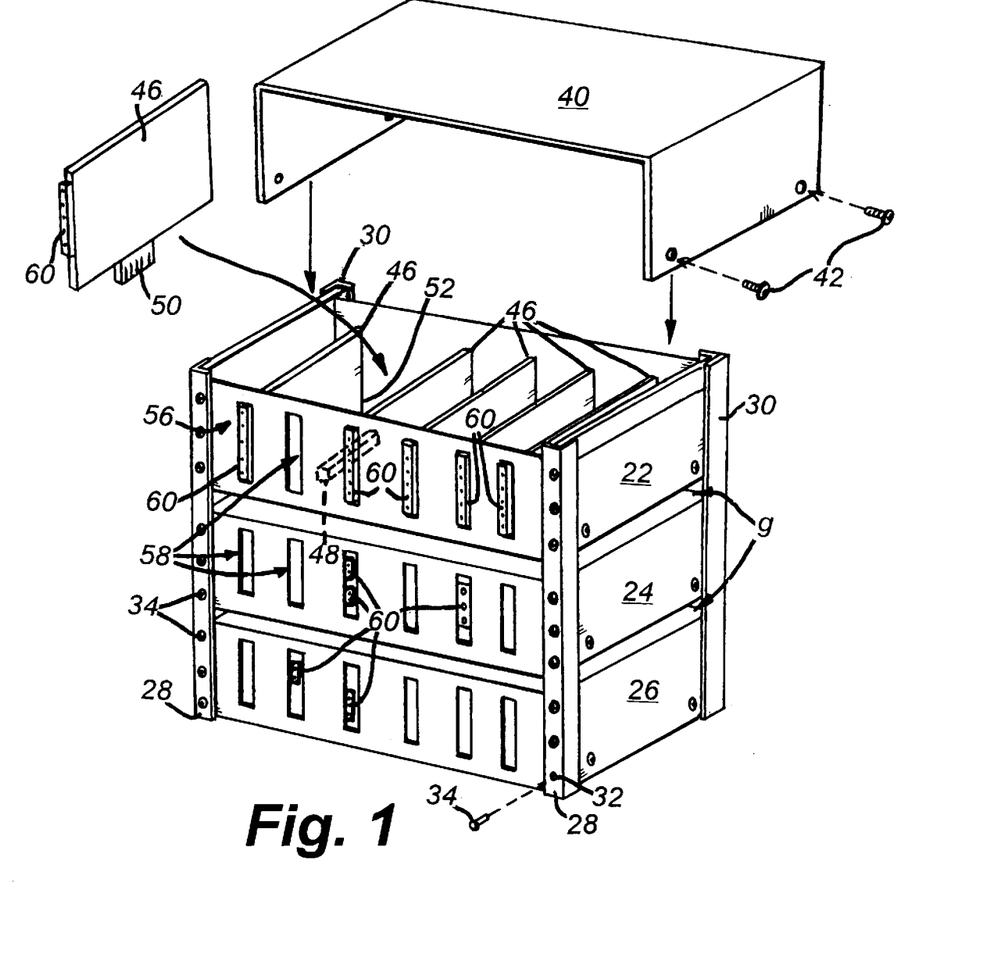
FIG. 1 is a somewhat schematic perspective view a set of rack-mounted chassis for housing a plurality of parallel circuit boards according to the prior art.

FIG. 1 details an exemplary rack 20 holding three vertical circuit board chassis 22, 24 and 26 according to the prior art. The rack 20 includes two front posts 28 and two rear posts 30 in this example. The rack can include only a pair of front posts 28 in an alternate arrangement. The front posts 28 can include a series of evenly spaced holes 32 along their lengths. The holes, and corresponding mounting holes or slots in each chassis (not shown) receive threaded fasteners 34 that secure the respective chassis to the rack 20. The lower chassis 24 and 26 are separated from each other and from the upper chassis 22 by respective gaps g. The gaps g are minimized, generally, to maximize vertical storage capacity of the rack system. As an example, the interior construction of the top chassis 22 is exposed. The top cover 40 is shown removed. Screws 42 are used to secure the cover 40 to the underlying housing. A variety of cover shape and securing arrangements are used. In all conventional arrangements, the top is removed to access circuit boards 46 stored inside. The circuit boards 46 are arranged in parallel, from front to back of the chassis. Each of the circuit boards 46 is attached to a respective female multiple-contact strip connector (connector 48 for example) via a corresponding male strip connector 50. The connectors are interengaged by applying downward pressure (arrow 52) to the board 46, and disengaged by applying opposing upward tension to the board 46. This connector arrangement requires that the interior of the chassis be accessed through the top. That is, sufficient room to slide the connectors together and pull the connectors apart exists when the top is opened.

Each chassis front panel 56 includes evenly spaced ports 58 through which various I/O connectors, status lamps and ports 60 are exposed. Besides acting as a series of port holes, the front panel 56 usually provides part of the chassis' structural integrity.

The gap g is usually too small to remove the top cover of lower chassis 24 or 26. Likewise, the overlying chassis obstruct installation and/or removal of circuit boards. Hence, to service the underlying chassis, the overlying chassis must be disassemble from the rack 20. This increases service time and labor, and may increase the chance of handling damage to components not being serviced due to droppage, accidental disconnection of components and the like.

Accordingly, it is therefore an object of this invention to provide a chassis for storing a plurality of circuit boards in parallel that enables rapid installation and removal of circuit boards from the chassis without necessitating removal of the top cover of the chassis, and without requiring substantial disassembly of rack-mounted components. The boards should remain securely mounted in the chassis once installed.

This invention overcomes the disadvantages of the prior art by providing a rack mountable chassis for multiple circuit boards that enables side loading of individual circuit boards, thus eliminating the need to remove a chassis top cover, and, in turn, to remove the chassis from its rack. Rather, aligned with respective connectors in the chassis upon entry, and a lifter mechanism allows the boards to be raised and lowered within the chassis by an external handle to selectively place them respectively out of and into contact with the chassis connectors.

According to a preferred embodiment, the top of the chassis includes a plurality of parallel tracks each in alignment with respective strip connectors on the mother board located adjacent the opposing bottom of the chassis. Each track receives a top edge of a respective framework that encloses a circuit board. A strip connector is exposed along a bottom edge of the framework. The motherboard and circuit board strip connectors are arranged so that the downward pressure on the board away from the top, and toward the bottom of the chassis) causes a friction-fit connection between the boards. Likewise various I/O ports and/or connectors are exposed on a side edge of the framework. The chassis and the frameworks are each arranged so that the board can enter through an opening in the side of the chassis along a respective track. The board is located in the framework, upon entry in an retracted position, with the board's strip connector located above and out of interfering contact with the chassis' corresponding strip connector. Once the board has been fully inserted into the chassis, the framework can be operated to cause the board to move downwardly, placing the strip connectors into pressurable contact with each other.

According to the preferred embodiment, the framework includes a circuit board-carrying portion, and an interconnected track-engaging portion. The lifter mechanism is provided to interconnect the track-engaging and board-carrying portions. The track-engaging portion includes pins, that ride within sloped slots in the board-carrying portion. Upon installation of a board into the chassis, the track engaging portion is in an extended position, having an operative end positioned remote from the board-carrying portion. The track-engaging portion is moved pressurably into the chassis along the track to place the operative end adjacent the board-carrying portion. This movement, in turn, causes the pins to pass along the sloped slots, urging the board-carrying portion downwardly.

In the preferred embodiment, the rear edge of the board-carrying portion of the framework includes an alignment member, such as a channel piece with parallel, rearwardly extending interior walls that engage a corresponding alignment structure mounted at the rear of the chassis. The alignment structure can comprise one or more hooks that selectively capture corresponding posts or rollers disposed between the interior walls of the channel piece when the board-carrying section is lowered to place the board connector into engagement with the motherboard connector.

In the preferred embodiment, the edge of the board-carrying portion having the I/O includes a removable edge piece with an I/O slot that exposes the I/O connectors. In combination, the edge pieces define the side wall of the chassis and provide further support to the chassis.

BRIEF DESCRIPTION OF THE DRAWINGS

The foregoing, and other objects and advantages of the invention will become more clear with reference to the following detailed description as illustrated by the drawings in which.

DETAILED DESCRIPTION

Figure 2:
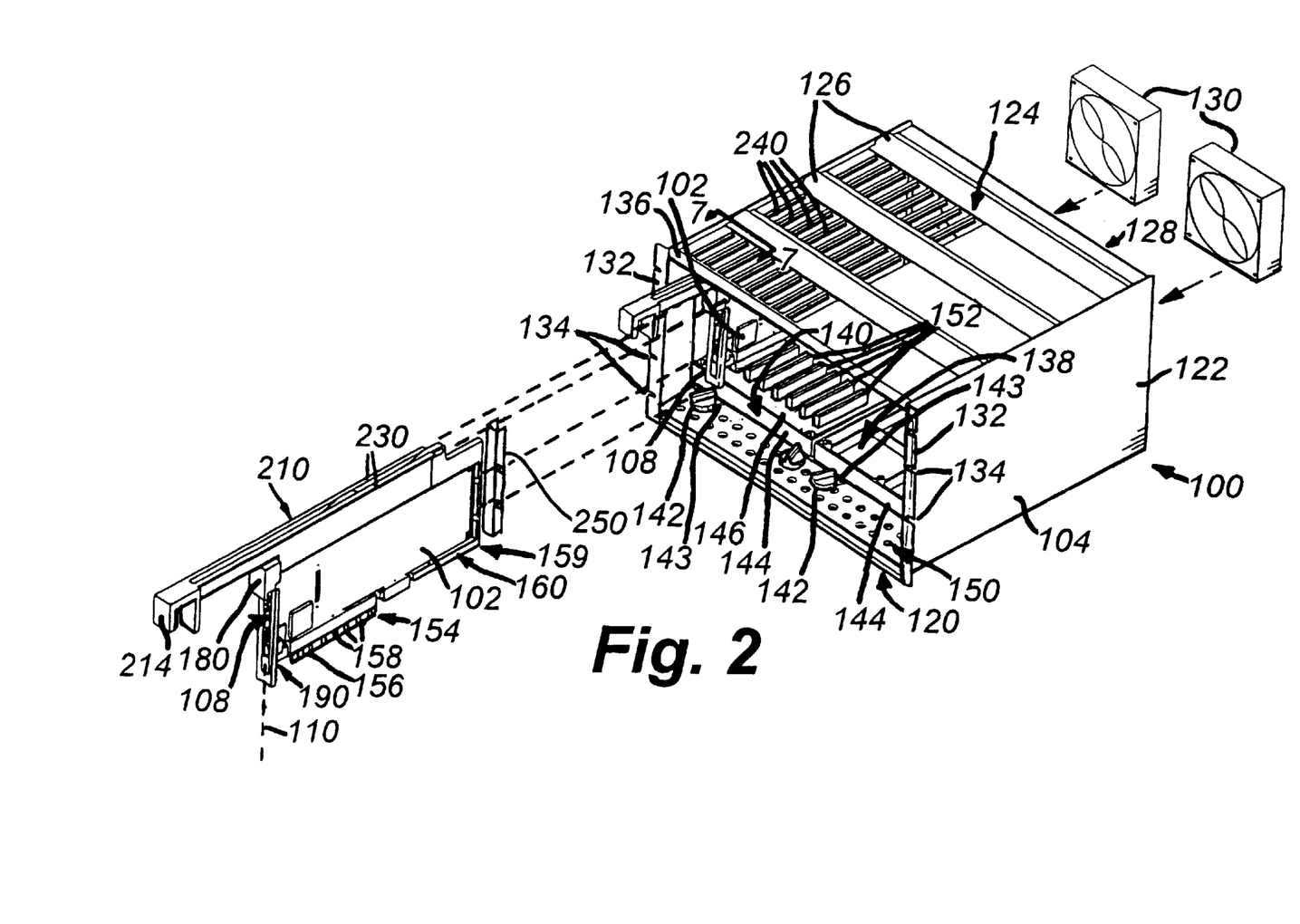
FIG. 2 is an exploded perspective view of a circuit board chassis system detailing the installation of a removable framework and corresponding circuit board according to this invention.

FIG. 2 details a chassis system 100 for housing a plurality of circuit boards in a parallel, side-to-side arrangement according to this invention. It is contemplated that all circuit boards 102 have a maximum height (top-to-bottom) and maximum depth (front-to-back) that is less than the interior walls of the chassis, but boards can be substantially smaller in size than the housing by modifying the frameworks described further below to fit the particular circuit board to be housed in the chassis. In one embodiment the housing or chassis 104 has an interior height of approximately 10½ inches, a depth of approximately 18–19 inches and a width of approximately 17½ inches. These dimensions, in essence, define the maximum height and length (in the depth direction) of a circuit board, and the maximum number of boards (in the widthwise direction) located in the chassis 104. The circuit boards 102 can comprise individual bus-linked interface cards and associated controllers implementing the PCI standard according to one embodiment. However, circuit boards having any electronic function and any particular circuit configuration are expressly contemplated.

In general circuit boards have a standard height of 7½ inches. The depth of boards can vary up to the maximum as described further below. Circuit chips, connectors and other projections from the board are typically all oriented along one face of the board (the face shown in all the figures herein). The opposing face (not shown) of each circuit board 102 contains a matrix of low-cut soldered lead wires exiting each of the circuit elements, and joined by printed circuit traces. The soldered circuit leads on the opposing face project no more than approximately 1/10 inch from the surface. Each circuit board typically includes on the exposed face, shown herein, one or more I/O ports, connectors or status indicators (e.g. LEDs) 108 along the front edge of the respective circuit board. These connectors project outwardly from the front edge, and are centered along a line 110 above the exposed face of the circuit board 102. The height of projection from the exposed face of the board is generally ½ inch. As such, the board tends to have a true that is greater than the thickness of the board and that is centered approximately around the line 110. This width is one limiting factor in how closely boards can be placed adjacent each other. In the chassis depicted according to the embodiment of FIG. 2, a total of sixteen boards are mounted. It is contemplated that more boards or fewer boards can be mounted according to alternate embodiments subject to the size limitations set forth above.

The chassis 104 includes a base or floor 120, a pair of opposing side walls 122 and a top 124, that includes a plurality of parallel cross members 126, defining an open top according to this embodiment. A top cover (not shown) can be provided to seal the top. The cross members are tied to the side walls 122 by rivets, welds or other forms of joints. The side walls and top are stamped from a single piece of sheet metal using conventional techniques according to this embodiment. The chassis back wall 128 includes conventional openings for connectors, power cords (not shown) and fans 130. The front edges of the side walls 122 include outwardly extended flange plates 132 having slots 134 for receiving rack-mounting bolts as described above. The side walls 122, front cross member 136 and floor 120 together define a front opening 138 according to this invention. As will be described in detail below, the front opening 138 provides access to install and remove circuit boards according to this invention.

The floor 120 of the chassis 104 supports a pair of side-by-side base frames 140 formed as gridworks from metal or plastic in this embodiment. The frames 140 are attached to the floor by screws or quick release systems, such as the hold-down knobs 142. The knobs 142 are each rotated so that locking plates 143 selectively engage slots in the front walls 144 of the frames 140. The frames 140 elevate the a respective section of the motherboard 146 above the floor for cooling purposes and also to provide room for cabling and any connectors or leads projecting from the underside of the motherboard 146. Note that the hold-down knobs 142 are positioned on a threshold plate 150 raised slightly above the floor 120. The threshold plate is optional. It is perforated for air passage that facilitates cooling. Various PCI status indicators and other structures can be located on the threshold plate 150 according to an alternate embodiment. The motherboard 146 can include a variety of circuits and connectors. In particular, each motherboard section includes eight parallel multiple-contact strip connectors 152 of conventional design extending from front to back near the front edge of the motherboard 146. Each motherboard connector 152 is female in this embodiment, and is arranged to receive a corresponding multiple-contact male strip connector 154 formed as a series of conventional contact pads 156 on the raised edge 158 of the circuit board 102. The number of contact pads can vary. Typically, twenty or more pads are employed in a strip. Pads can be disposed on both sides of a circuit board.

Since the strip connectors generally enable insertion on the board only in a downward direction, the circuit board 102 should be located with its connector 154 directly over the motherboard connector 152 before downward pressure is applied to bring the connectors 152, 154 into engagement. The same is true for disengagement—the board should be withdrawn upwardly before rearward pressure is applied to withdraw the board from the chassis 104. On average, 1⅜ inches of vertical clearance is needed to move the circuit board connector 154 fully into and out of the motherboard connector 152. Accordingly, a special framework 159 surrounds each circuit board 102 to facilitate the upward and downward motion relative to the motherboard, and to ensure that the circuit board connector is properly aligned with the motherboard connector during the connection/disconnection process.

With further reference to FIGS. 3–6, the framework 159 is shown in greater detail. The framework 159 includes a lower board-carrying portion 160 that surrounds each of the top, bottom and rear edges of the circuit board 102 with a corresponding upper edge 162, lower edge 164 and rear edge 166. The edges 162, 164 and 166 are formed as an integral unit in this embodiment from a durable plastic such as ABS. Alternatively separate pieces can be assembled into a framework and other materials such as aluminum can be used in the construction of the framework. The edges 162, 164 and 166 can be joined by a backing plate (not shown) along the rear face of the circuit board (the face that confronts the soldered leads). Alternatively, the board-carrying portion 160 of the framework 159 can remain open within its interior perimeter. The width W of the board-carrying portion 160 is between ½ and ⅝ inch in a preferred embodiment, but other widths are expressly contemplated. The upper and lower edges 162 and 164 are formed with channels having an internal width sufficient to seat the corresponding edges of the board 102, so that the board is captured by the framework, and restrained against widthwise movement. The front of the lower edge 164 is open to allow the connector 154 to pass therethrough. The edge surrounding the connector should be, in particular sufficiently open to allow the motherboard connector to pass thereinto without interference. As noted above, the I/O port at the front edge is approximately centered relative to the width W of the board-carrying portion 160. Accordingly, the channels in the edges 162 and 164 are formed so that the circuit board 102 is seated at an offset relative to the center line 110. In other words there is more widthwise space between the right side of the board 102 (as viewed) and the right side wall 170 of the board-carrying portion 160 than the widthwise space between the left side of the board 102 and the portion's left side wall 172. This enables the I/O, which stands "proud" of the board's surface, to be centered in the framework, and also provides clearance for circuit chips and other structures projecting from the board surface.

Figure 3:
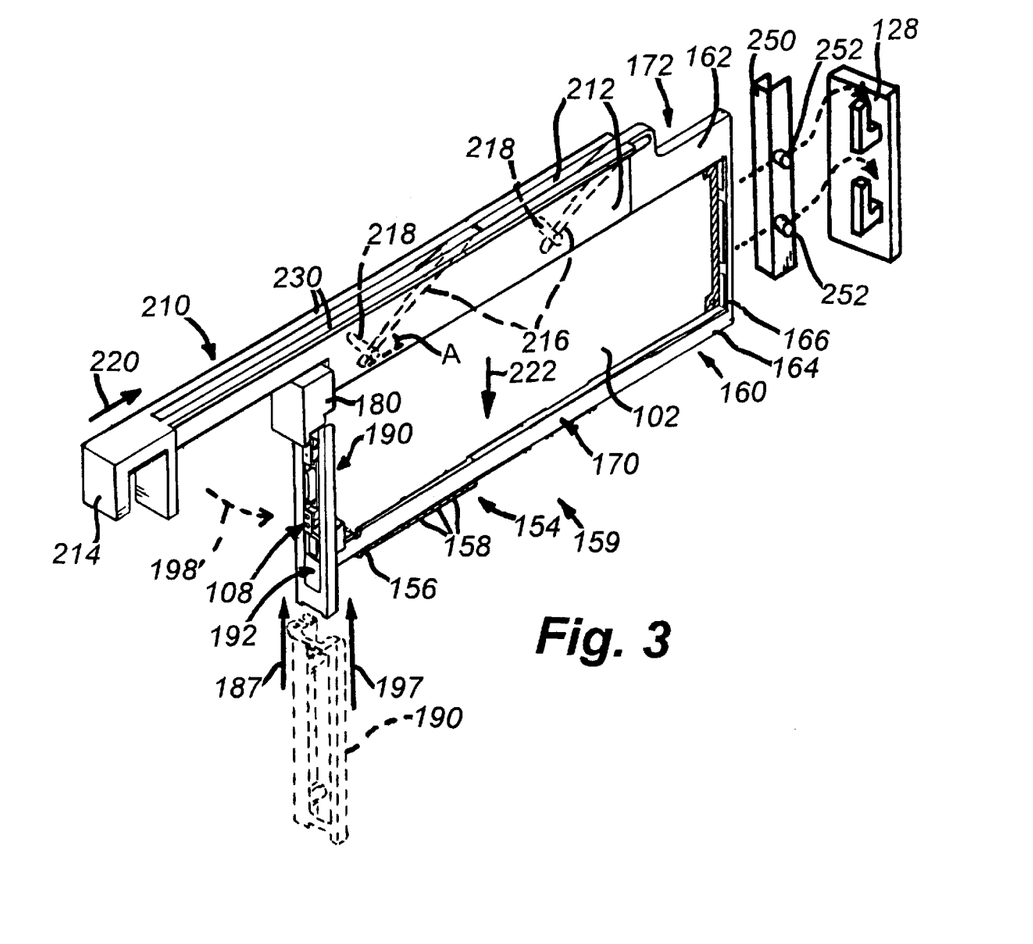
FIG. 3 is a perspective view of a framework and an attached circuit board for the chassis system of FIG. 2, in which the framework components are in an extended position, enabling the framework to enter the chassis.

In this embodiment, the front end of the lower board-carrying portion 160 of the framework 159 can be selectively opened to allow the board to be inserted and removed by sliding the board along the upper and lower edge channels. The front of the upper edge 162 includes a projecting stop 180 that can be formed integrally with the upper edge. The stop 180 has sufficient clearance to enable the board to pass over it upon insertion and removal from the portion 160. Alternatively, the stop 180 can be removable.

Figure 4:
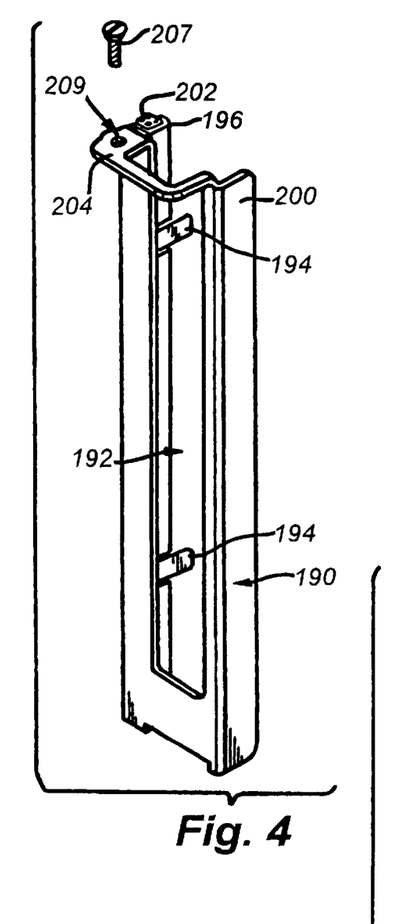
FIG. 4 is more-detailed perspective view of the removable side end piece for use with the framework of FIG. 3.
Figure 8:
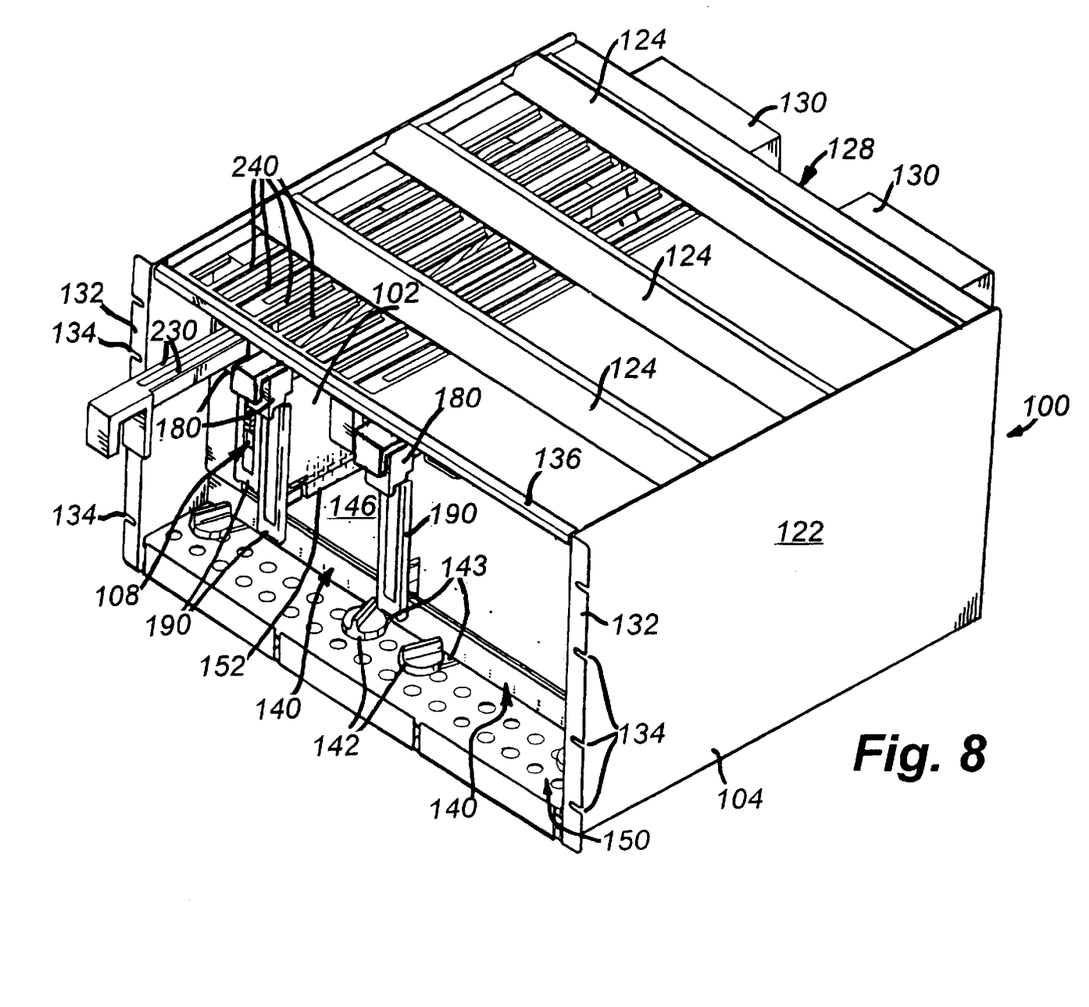
FIG. 8 is a perspective view of the chassis system of FIG. 2 having frameworks assembled thereinto according to this invention.

The front edge of the board-carrying portion, in this embodiment, is secured by a removable insert 190 shown in greater detail in FIG. 4. The insert can be formed from plastic or from stamped sheet metal (Such as ¹⁄₁₆ inch aluminum). It includes a central hole 192 sized to allow desired I/O to be exposed therethrough. The hole 192 can be a standard size and shape to accommodate all popular I/O or can be customized to the particular I/O application. The insert 190 is attached to the front edge of the board 102 as shown generally in FIG. 3. That is, it can be slid up from beneath the stop 180 (arrows 197) until it is fully attached to the board by clips 194 that are spaced from the left wall 196 a sufficient distance to enable a pressure fit of the insert to the front edge of the board 102. In practice, it may be desirable to rotate the insert into final pressurable contact with the edge (curved arrow 198) once it is adjacent to the stop 180 to minimize frictional sliding of the clips directly over the surface of the board. The right side wall 200 and left side wall 196 together define the maximum width of the framework 159. The left side wall 196 is formed with an outer-facing pocket, that receives an elastomeric strip 202. the strip 202 is designed to pressurably, and sealingly engage an adjacent right side wall of another framework. When all frameworks are installed in the chassis of this invention, the inserts form a sturdy composite front wall with a series of evenly spaced I/O holes or slots (see generally FIG. 8). A top stop 204 is also provided to engage the bottom face of the framework stop 180. The top stop can include a screw hole 209 that receives a screw 207. The screw is positioned through a corresponding hole (not shown) in the framework stop 180.

Figures 6, 7:
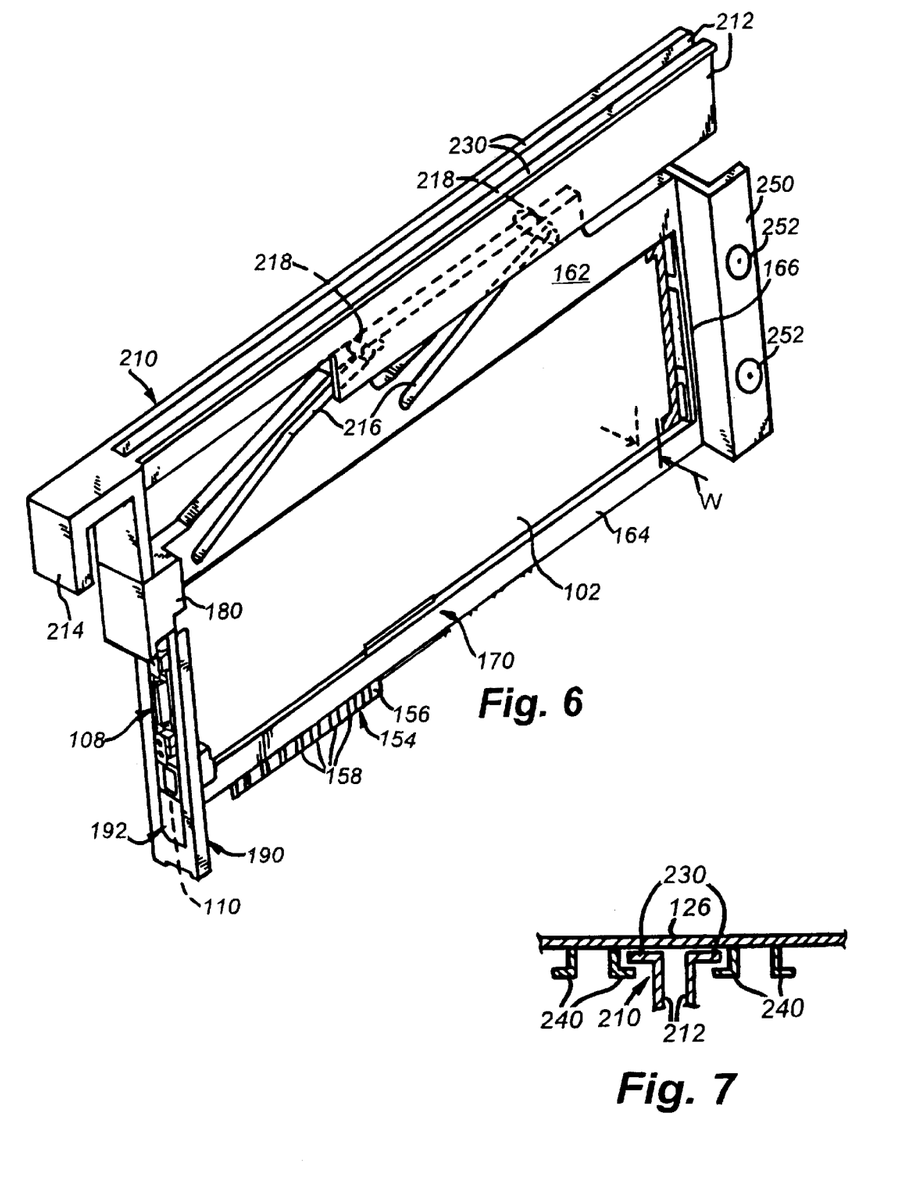
FIG. 6 is a perspective view of the framework of FIG. 3 in which the framework components are in a withdrawn position, enabling interconnection of the circuit board with the chassis mother board.
FIG. 7 is a partial cross-section of an interengaging track and framework taken along line 7—7 of FIG. 2.

The framework 159 also includes an upper portion 210 that is slidable relative to the lower board-carrying portion 160. The upper portion includes a pair of side walls 212 that are spaced apart approximately the width W. The side walls 212 enclose and capture the upper edge 162 of the board-carrying portion 160. The portions 160 and 210 move relative to each other between an uninstalled position (FIG. 3) and an installed position (FIG. 6). In the uninstalled position, the handle 214 of the upper portion 210 is remote from and forward of the stop 180. The lower and upper portions 160 and 210 of the framework 159 are connected by a ramp structure that comprises a pair of posts or rollers 218 that ride in corresponding sloped slots 216. In FIG. 3, the rollers 218 have ridden on respective slots 216 so that the upper edge 162 of the lower portion 160 is in close proximity to the upper portion 210. Note that the rollers are fixed between the side walls 212 of the upper portion 210. When, however, the handle 214 is moved toward the stop 180 (see arrow 220 in FIG. 3) the rollers 218 ride along the sloped slots 216, urging the lower portion, and its card 102, to move downwardly, away from the upper portion 210 (see arrow 222 in FIG. 3). Hence by moving the handle 214 toward and away from the slot, the card 102 can be moved linearly downwardly and upwardly with respect to the upper portion 210. The slots 216 are sloped upwardly in a front-to-back direction at an angle A. The angle A is between approximately 10 and 30 degrees in one embodiment. The angle A can vary. It is chosen so that two-four inches of movement by the handle 214 causes the requisite 1⅜ inches or more of movement of the board 102 in a transverse direction (perpendicular in this example).

The upper portion 210 includes a pair of outward-facing wings 230 that in essence define the top of a "T." With further reference to FIG. 7 the wings 230 are sized and arranged to pass over track sections 240 attached to the interior-facing sides of the cross members 126 on the top of the chassis 104. The front ends of the track sections 240 are opened, allowing the rear ends of the wings to pass into the tracks 240, and to be captured by the tracks. The wings 230 allow the frameworks to slide rearwardly into the interior of the chassis along the tracks 240 in a well-aligned orientation with minimal movement in the widthwise directions. The tracks 240 are applied to the cross members or another upper frame member of the chassis by screws, welds or other fasteners. The tracks 240 are aligned so that each circuit board connector 154 is in widthwise alignment with a respective motherboard connector 152. In other words, each track defines a "slot" in the chassis adapted to receive a given circuit board. As shown in FIG. 2, the handle 214 of the upper portion 210 of the framework 159 is withdrawn to an uninstalled position (remote from the stop 180) as the wings 230 are slid onto the tracks 240. This enables the connector 154 to pass over the motherboard connector 152 without interference.

Figure 5:
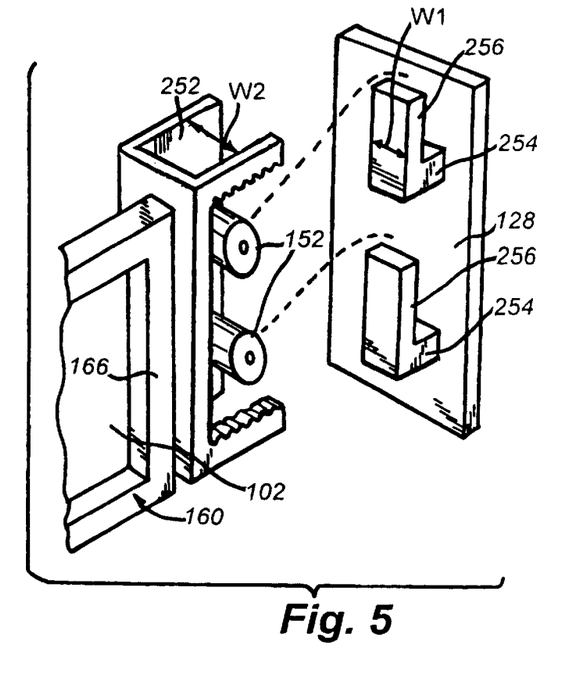
FIG. 5 is an exposed perspective view of the rear locking pins and interengaging chassis rear wall hooks for the chassis system of FIG. 2.

Front-to-back alignment and widthwise alignment of each framework 159 is further maintained by a rear channel piece 250 that is shown in further detail in exposed view in FIG. 5. The rear channel piece 250 is open at its top and bottom in this embodiment and encloses a pair of posts or rollers 252. The rear channel piece 250 is attached to the rear edge 166 of the lower board-carrying portion 160 of the framework 159 by any acceptable fastener arrangement. Each of the rollers 252 is located to engage each of a respective pair of hooks 254 located in conjunction with each "slot" in the chassis 104. The width W1 of the hooks is equal to or slightly less than the interior width W2 of the rear channel piece 250 so that the hooks prevent substantial side-to-side (widthwise) movement of the framework when the rear channel piece is passed over the hooks 254. The hooks 254 include raised walls 256 that enable the rollers 252 to pass thereover when the lower portion 160 is in a raised (uninstalled) position on the tracks 240. The wall stops the lower portion 160 and its circuit board 102 from further rearward movement. When the lower portion 160 is at this rearwardmost position in the slot, the connectors 152 and 154 are fully aligned (see FIG. 8). At this time, the handle 214 can be moved forwardly toward the stop 180 until is engages the stop fully. The lower portion 160 and its circuit board 102 are moved downwardly in a line substantially perpendicularly to the movement of the handle 214 a distance of approximately 1⅜ inches, causing the connectors 152 and 154 to make firm contact. At the same time, the rear channel rollers 252, pass behind the raised walls 256 of the hooks 254, causing the hooks to firmly capture the rear of the framework, and preventing inadvertent removal of the framework. The circuit board is now fully installed. The installation procedure is quick and convenient using the system of this invention.

Removal of a card entails the opposite procedure. The handle 214 on a selected framework 159 is drawn away from the stop 180, causing the lower portion 160 and its board 102 to rise out of the connector 152 and the rear hooks 254. Further outward pulling action on the handle 214 causes the wings 230 to ride outwardly along the tracks 240 until the framework 159 is pulled clear of the tracks. Again, the removal process is quick and convenient using the system of this invention.

While a circuit board that is fully surrounded by the lower portion of the framework is detailed. It is expressly contemplated that a circuit board that is smaller than a standard size can be employed. Appropriate spacers can be applied to either the bottom or top edge, the front or rear edge, or both. The spacers enable the circuit board to be located so that its connector is aligned with the motherboard connector 152 when the framework is in an installed position within a slot in the chassis. The framework, itself can be modified with shortened edges to seat a non-standard sized board where appropriate. When so modified, the rear edge should still include a stop to engage the chassis rear wall and hooks at the appropriate location. Other modifications to the tracks of the chassis can be undertaken to accommodate non-standard sized circuit boards where appropriate.

Note that a related system fo inserting and removing circuit boards from a front opening in a rack-mountable chassis involving the use of a pivoting structure that causes a substantially upward and downward movement of the framework with respect to the motherboard alond a curved path is detailed in applicants' copending U.S. patent application entitled "Circuit Board Chassis" and filed on even date herewith. The teachings of this copending patent application are expressly incorporated herein by reference.

The foregoing has been a detailed description of a preferred embodiment of the invention. Various modifications and additions can be made without departing from the spirit and scope of the invention. For example, the arrangement of side walls, slopes and edge configuration of the upper and lower portions of the framework can be changed. In general, the movement of one portion of the framework carrying the circuit board with respect to another should cause selective raising and lowering of the circuit board. Nevertheless, it is contemplated the the chassis' track, itself can include a ramp structure that is arranged to move a single framework unit upwardly and downwardly with respect to the motherboard in an alternate embodiment when a given movement pattern is applied to either the track or the framework. The movement of the handle, likewise, can cause non-perpendicular movement of the board, so long as it selectively connects and disconnects the circuit board from the motherboard. The track arrangement can be modified or located at a position other than the interior top of the chassis. Likewise, the removable front inserts can be substituted for another structure, such as a permanent slot. In addition, the manner in which a circuit board is attached to the framework can be varied. Accordingly, this description is meant to be taken only by way of example and not to otherwise limit the scope of the invention.

What is claimed is:

1. A system for housing a plurality of removable circuit boards each having a board connector interconnected with a respective motherboard connector of a motherboard installed in a chassis comprising:

a track extending from an open front side of the chassis along the interior of the chassis to a location adjacent an opposing rear side of the chassis;

a framework including a board-carrying portion that engages the edge of the circuit board and that includes an opening through which the circuit board connector projects and a track-engaging portion constructed and arranged to slide along the track and to be installable on and removable from the track through the open front side of the chassis, the board-carrying portion being operatively connected to the track-engaging portion; and a ramp structure interconnecting each of the board-carrying portion and the track-engaging portion, the ramp structure being constructed and arranged so that movement of the track-engaging portion with respect to the board-carrying portion along a first direction causes the board-carrying portion to move in a second direction, transverse to the first direction to selectively engage and disengage the board connector with the motherboard connector when the framework is located at a predetermined position within the chassis.

2. The system as set forth in claim 1 wherein the ramp structure comprises a pair of rollers mounted between opposing side walls on the track-engaging portion and a pair of sloped slots located on an edge of the board-carrying portion in which the rollers ride, the edge of the board-carrying portion being positioned between each of the opposing side walls and the slots being sloped at a non-parallel and non-perpendicular angle with respect to a plane defined by the track.

3. The system as set forth in claim 1 wherein a front edge of the board-carrying portion is constructed and arranged to allow the circuit board to be selectively inserted thereinto and removed therefrom, and further comprising a removable front insert for covering a portion of the front edge.

4. The system as set forth in claim 1 further comprising a rear alignment member mounted on a rear edge of the board-carrying portion that selectively engages an alignment structure mounted on the chassis adjacent the rear thereof whereby the alignment structure restrains the board-carrying portion against side-to-side movement transverse to the first direction and allows movement in the second direction.

5. The system as set forth in claim 1 wherein the first direction is aligned with a direction of sliding of the track-engaging portion with respect to the track and wherein the second direction is substantially perpendicular to the first direction.

6. The system as set forth in claim 1 wherein the chassis includes, adjacent the open front side, a pair of rack-mount support structures that enable the chassis to be attached to a rack for supporting a plurality of chassis in a vertical stack.

7. The system as set forth in claim 3 wherein the front insert includes a pair of opposing parallel upstanding side walls substantially parallel to a plane of the circuit board, constructed and arranged to engage adjacent opposing parallel upstanding side walls of other front inserts located on adjacent frameworks in the chassis.

8. The system as set forth in claim 3 wherein the front insert includes an opening for exposing an I/O structure on the circuit board.

9. The system as set forth in claim 7 wherein one of the pair of opposing parallel upstanding side walls includes an elastomeric strip for pressurably engaging the adjacent opposing parallel upstanding side wall.

10. The system as set forth in claim 4 wherein the alignment member comprises a channel having inner side walls and a post extending therebetween and wherein the alignment structure comprises a hook sized to pass between the inner side walls, the hook selectively engaging and disengaging the post when the post is moved along the second direction, the post being engaged when the board connector is interconnected with the motherboard connector.

11. A method for assembling a plurality of circuit boards having circuit board connectors into a chassis having a motherboard with a motherboard connector for interconnecting the circuit board connector, comprising the steps of:
providing a track disposed along a top of the chassis and extending from an open front of the chassis to a rear of the chassis;
providing a framework including a board-carrying portion that engages an edge of the circuit board and that exposes the circuit board connector at a bottom edge thereof and a track-engaging portion that movably engages an upper edge of the board-carrying portion and that is arranged to slide relative to the track;
sliding the framework into the chassis, including sliding the track-engaging portion onto the track to a position within the chassis in which the circuit board connector is aligned with and remotely above the motherboard connector; and
moving the track-engaging portion relative to the board-carrying portion to direct the circuit board connector from the position above the motherboard connector into a position in which the circuit board connector engages the motherboard connector.

12. The method as set forth in claim 11 wherein the step of moving the track-engaging portion further comprises, directing the track-engaging portion in a direction of the step of sliding and thereby causing a ramp structure to urge the board-carrying portion toward the motherboard connector.

13. The method as set forth in claim 11 further comprising locating the chassis in a vertical rack having a plurality of chassis located therein.

14. The method as set forth in claim 12 wherein the step of sliding includes engaging the board-carrying structure with a rear wall of the chassis to restrain further rearward movement of the board-carrying structure as the step of directing occurs.

15. The method as set forth in claim 14 further comprising installing a removable front insert on the framework having upstanding walls that defined a portion of a front wall and that includes an opening exposing I/O on the circuit board.

16. A rack-mounted chassis having a top and a bottom and sides including a rear and an open front for accessing an interior of the chassis, the bottom including an interior-mounted motherboard with a plurality of parallel connectors arranged along a line parallel to the open front, each of the connectors defining a slot for mounting a respective circuit board connector of a respective circuit board thereinto and each slot having a respective track, comprising:
a circuit board framework attached to each respective circuit board, the framework including a board-carrying portion and an operatively connected track-engaging portion each being slidable along the track of the respective slot; and
a lifter mechanism including a ramp assembly disposed between the track-engaging portion and the board-carrying portion constructed and arranged so that movement of a portion of the ramp assembly with respect to the board carrying portion in a first direction thereby moves the board-carrying portion in a second direction to thereby move the respective of the circuit board connectors into and out of engagement with the motherboard connector in the second direction when the track-engaging portion is positioned within the chassis on the track and the framework being movable into and out of the chassis along the track when the respective of the connectors is moved out of engagement with the motherboard connector.

17. The chassis as set forth in claim 16 wherein the ramp assembly comprises a sloped slot and an interengaging roller located in the slot, each of the slot and the roller being located on each of the board-carrying portion and the track-engaging portion respectively and movable relative to each other so that a movement in the first direction of the track-carrying portion causes movement of the board-carrying portion to thereby move the respective of the circuit board connectors in the second direction, the second direction being transverse to the first direction.

18. The chassis as set forth in claim 16 wherein the track-engaging portion includes a handle attached to the framework and located adjacent the open front of the chassis constructed and arranged so that moving the handle outwardly away from the chassis along the first direction thereby moves the respective of the circuit board connectors in the second direction away from, and out of engagement with, the mother board connector and so that moving the handle inwardly toward the chassis along the first direction thereby moves the respective of the circuit board connectors in the second direction toward, and into engagement with, the mother board connector.

19. The chassis as set forth in claim 17 wherein the framework includes a removable insert on a front end thereof that defines part of a front wall for enclosing the open front, the insert having an I/O opening therein for exposing I/O of the circuit board and having upstanding walls that define sides of the insert and that are constructed and arranged to engage adjacent upstanding walls of an adjacent removable insert whereby a continuous wall is formed therebetween.

20. The chassis as set forth in claim 18 wherein the handle is formed on a front end of the track-engaging portion for thereby moving the track-engaging portion a predetermined distance therealong to thereby move the respective of the circuit board connectors into and out of engagement with the mother board connector, and the handle being further constructed and arranged so that moving the handle inward toward the chassis beyond the predetermined distance causes the handle to stop and moving the handle outward away from the chassis causes the framework to slide out of the chassis through the open front.

* * * * *